United States Patent [19]

Scifres et al.

[11] Patent Number: 5,065,401
[45] Date of Patent: Nov. 12, 1991

[54] PULSE JITTER REDUCTION METHOD FOR A LASER DIODE OR ARRAY

[75] Inventors: Donald R. Scifres, San Jose; John G. Endriz, Belmont, both of Calif.

[73] Assignee: Spectra Diode Laboratories, Inc., San Jose, Calif.

[21] Appl. No.: 660,804

[22] Filed: Feb. 26, 1991

[51] Int. Cl.$^5$ .............................................. H01S 3/00
[52] U.S. Cl. ...................................... 372/38; 372/25; 372/26
[58] Field of Search .................. 372/38, 26, 25, 29

[56] References Cited

U.S. PATENT DOCUMENTS

| | | | |
|---|---|---|---|
| 3,764,936 | 10/1973 | Baues | 331/94.5 |
| 4,480,325 | 10/1984 | Aiki et al. | 372/38 |
| 4,712,218 | 12/1987 | Ohnuki et al. | 372/38 |
| 4,815,085 | 3/1989 | Javan | 372/32 |
| 4,827,481 | 5/1989 | Sasaki | 372/26 |
| 4,888,777 | 12/1989 | Takeyama | 372/25 |

Primary Examiner—Léon Scott, Jr.
Attorney, Agent, or Firm—Schneck & McHugh

[57] ABSTRACT

A method of driving a multimode laser diode has pulse circuitry providing a sequence of drive current pulses to the laser and modulation circuitry superimposing a modulation current upon the drive current pulses. When the modulation amplitude and rate are sufficiently great, rapid switching of transverse modes of laser operation is induced during each laser pulse. The effect of many different modes is averaged out so that the observed light output, even in a high power apertured system, is stable both within a single pulse and from one pulse to the next.

15 Claims, 1 Drawing Sheet

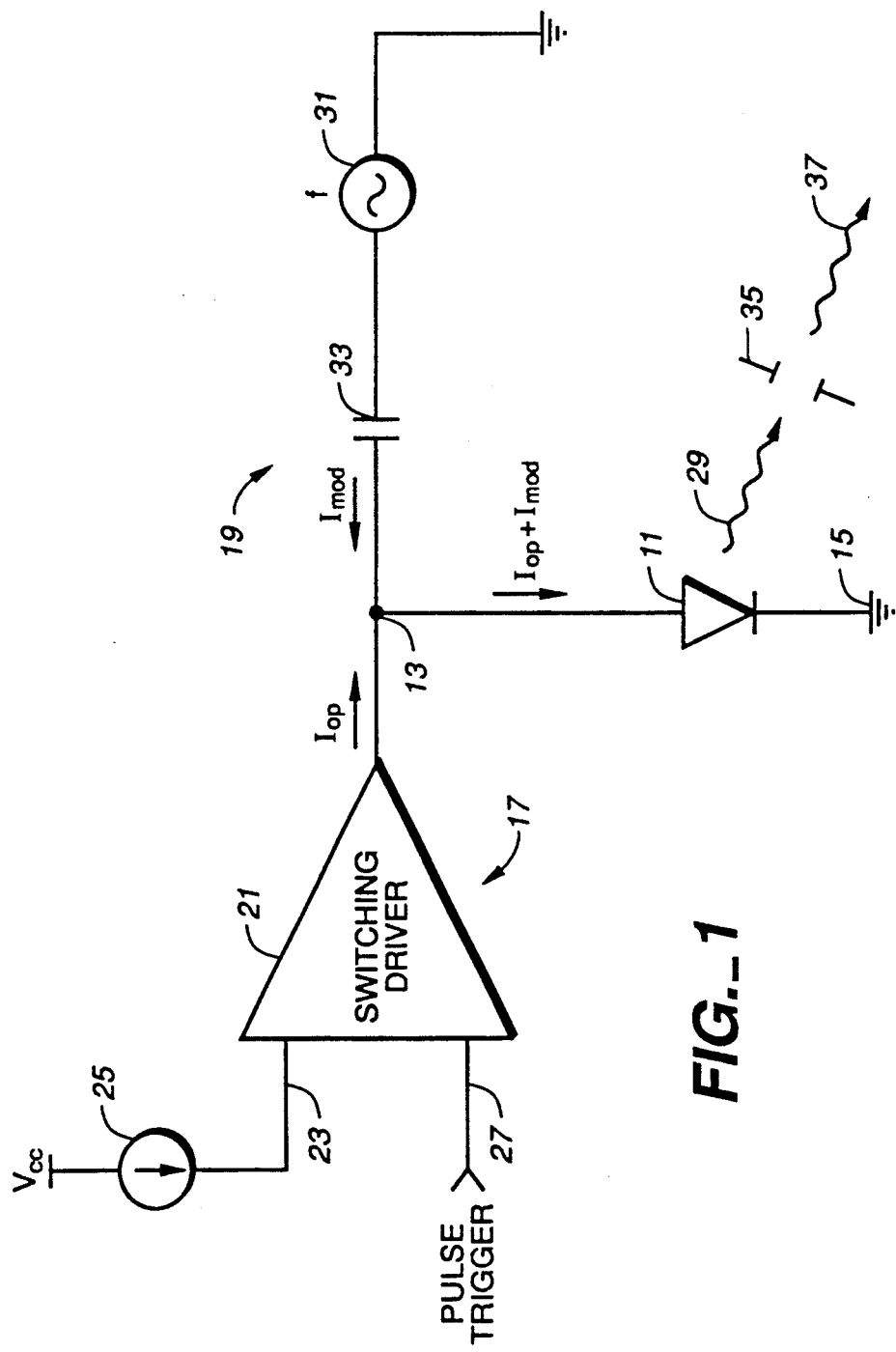
FIG._1

PULSE JITTER REDUCTION METHOD FOR A LASER DIODE OR ARRAY

TECHNICAL FIELD

The present invention relates to laser diodes and diode laser arrays operated in a high power pulsed manner, and in particular to methods of stabilizing the output characteristics, especially the observed amplitude or intensity, of pulses emitted from such lasers.

BACKGROUND ART

Whenever multiple transverse mode (multimode) lasers, such as broad-area laser diodes or phase-locked diode laser arrays, are operated in a pulsed manner with high peak power outputs, pulse jitter may occur. Pulse jitter is a change or variation in the observed optical power output, either between different pulses in a series of pulses or within a single pulse. If all of the optical power emitted from the laser is collected, there is usually very little pulse jitter. However, if the optical beam is apertured, i.e. passes through some kind of aperture whereby only a portion of the total optical power output is collected, then pulse jitter is greatly enhanced. The aperture may be a physical aperture, such as a stop or a lens system, an optical fiber, or a virtual aperture which behaves like a physical aperture.

Pulse jitter is caused by the laser switching between several or many of the available transverse modes of operation. Mechanisms causing switching may include thermal effects or optical feedback into the laser cavity. Because the available power is shared by the operating modes in a laser, very little variation in total output power is observed in an unapertured beam. However, due to the different angular directions of light output from the various laser modes, as such modes switch on and off, an apertured beam will vary in intensity, hence the enhanced pulse jitter.

An object of the present invention is to provide a method of reducing pulse jitter in laser diodes and diode laser arrays, leading to a more stable power output per pulse, even when the optical beam is apertured.

DISCLOSURE OF INVENTION

The above object has been met with a method in which a laser pulse is rapidly modulated in order to randomly excite and rapidly switch between many transverse modes. A modulation depth of at least one percent of the average power output during a pulse is sufficient to excite and cause switching between the various modes. If the modulation rate is sufficiently rapid, that is, about 5–10 modulations per pulse or greater, the observed effect on a pulse will be to mix and average out the individual effects of the many modes during the pulse. In particular, the aperturing effect will be averaged out, thereby allowing a stable power output per pulse even if the output beam is apertured.

BRIEF DESCRIPTION OF THE DRAWING

FIG. 1 is a schematic diagram of the circuitry driving a laser diode in accord with the method of the present invention.

BEST MODE OF CARRYING OUT THE INVENTION

With reference to FIG. 1, an injection controlled, multiple-transverse mode (multimode) laser diode 11, such as a broad area laser, a laser array, or a phase-locked laser array, is electrically pumped by injection of a modulated pulsed drive current $I_{op} + I_{mod}$ into the laser diode 11. Modulation consists of varying the amplitude of the drive current pulses $I_{op}$ by superimposing a modulating current $I_{mod}$ thereon. The modulating current is typically a periodic ac current, with an amplitude less than the drive current pulses $I_{op}$ so that the laser always remains forward biased, but can also be nonperiodic in either amplitude, frequency or both and can be a nonconstant dc current added to the drive current pulses. The modulated drive current $I_{op} + I_{mod}$ is, for example, provided by connecting the electrodes of the laser diode 11 between a node 13 and ground 15 in a forward biased manner, where the node 13 is coupled to a combination of pulse circuitry 17 and modulation circuitry 19. A feature of the invention is that the modulation is rapid enough so that the effect of many induced transverse modes on the observed light output is averaged out.

The pulse circuitry 17 is well known in the laser art and might include a switching driver element 21 1 15 having a first input 23 connected to a current source 25 plugged into an electrical power supply $V_{cc}$. The switching driver element 23 also has a second input 27, functioning as a control input, which receives a PULSE TRIGGER signal. Responsive to this signal, the switching driver element 21 provides a sequence of driving current pulses $I_{op}$ through node 13 to the laser diode 11. The peak current of such pulses, typically on the order of several hundred milliamperes, should be above the threshold of laser operation such that laser light output pulses 29 are produced by the laser diode 11. Preferably, the driving current pulses $I_{op}$ would be substantially above the laser threshold current so that the optical power output from the laser diode 11 is high, i.e. at least one watt. The waveform of the driving current pulses $I_{op}$ typically approximates a square wave, but this is not absolutely essential.

The modulation circuitry 19 is also known in the art, but in this invention is used to deliberately excite switching of laser operation between the several available transverse modes in the multimode laser diode 11. The modulation circuitry 19 might, for example, include an oscillator element 31 set to a particular frequency f which is coupled to node 13 via an isolating capacitor 33 of capacitance value such that the slower drive signal is substantially routed to laser diode 11. The oscillator element 31 provides a modulated current $I_{mod}$ to node 13, where it is superimposed upon the driving current pulses $I_{op}$ to produce the modulated pulsed laser drive current $I_{op} + I_{mod}$ supplied to laser diode 11. In order for the random switching of the laser diode 11 between the various transverse modes of operation to be induced, the modulation current $I_{mod}$ should have a modulation amplitude of at least 1% of the peak current of the driving current pulses $I_{op}$. Thus, the laser drive current $I_{op} + I_{mod}$ will have a modulation depth of at least 1%. In order that the switching of modes be rapid enough, so that the overall effect of the many modes on the observed light output is averaged out over an entire pulse, the modulation rate f should be high, at least 5–10 modulations per pulse and preferably 50 or more modulations per pulse. For a typical pulse width of 5 μs, the modulation rate should be approximately 1 MHz or greater. While the typical modulating current $I_{mod}$ will be periodic, strict periodicity is not essential, since any rapid and sufficiently deep jiggling or variation of the laser drive current $I_{op}+I_{mod}$ about a current pulse $I_{op}$ can excite rapid switching of the transverse modes of the laser output. In the case of an aperiodic modulating current $I_{mod}$ we can define a modulation rate as the number of times during a laser pulse that the modulated drive current $I_{op}+I_{mod}$ reaches a maximum or minimum which differs from the previous maximum or minimum by at least a specified amount for mode switching, which amount we will call the "minimum modulation depth."

This method of reducing pulse jitter by superimposing a high frequency modulation on the drive current pulses to excite rapid mode switching is particularly advantageous when the laser light output pulses 29 are apertured through a spatial stop 35. Because of the sharing of power between the several modes, if all the output light 21 were collected very little variation in output power would be observed. However, the different modes have different spatial propagation characteristics, such as different angular divergences, so that in a system in which only a portion 37 of the total light output is collected, the observed power varies greatly among the various modes. Rapid and random switching of modes during a pulse leads to a stable observed power output per pulse even when a stop 35 is used to aperture the light.

Since the laser pulse jitter may in part arise from optical feedback effects and since these feedback effects may serve to cause the threshold levels between various transverse modes to be larger than the specified 1% modulation depth required to induce transverse mode switching, it is simultaneously desirable to reduce optical feedback into the laser. This may be accomplished by antireflection coating or angling all elements of the optical system which may cause light reflection back into the laser. Other reflection reducing means such as optical isolators or polarization rotation may also be used. If these steps are insufficient a deeper modulation depth, more rapid modulation rate relative to the drive pulse or both may be utilized.

We claim:

1. A method of stabilizing observed output characteristics of light pulses emitted from multiple-transverse-mode laser diodes comprising:
   providing an injection controlled multimode laser diode with a sequence of driving current pulses, said driving current pulses being above a threshold of laser operation such that laser light output pulses are produced, and
   superimposing a modulating current on said driving current pulses, said modulating current having a modulation depth of the driving current pulses of at least a threshold for inducing random switching of the laser diode between transverse modes of operation, said modulating current having a high modulation rate such that the induced switching of transverse modes is rapid, whereby the effect of many modes on the observed light output is averaged out over an entire pulse.

2. The method of claim 1 wherein said multimode laser diode is a broad area laser.

3. The method of claim 1 wherein said multimode laser diode is a laser array.

4. The method of claim 1 wherein said laser light output pulses are apertured such that the observed light output is only a portion of the total light output from the laser diode.

5. The method of claim 1 wherein said driving current pulses are substantially above threshold such that the optical power output of the laser diode is at least one watt.

6. The method of claim 1 wherein said modulation rate is at least 10 modulations per pulse.

7. The method of claim 1 wherein said modulation rate is at least 1 MHz.

8. The method of claim 1 wherein said laser diode is provided with means for reducing optical feedback into said laser diode.

9. A method of stabilizing observed output characteristics of light pulses emitted from multiple-transverse-mode laser diodes comprising:
   providing an injection controlled multimode laser diode with a sequence of driving current pulses, said driving current pulses being above a threshold of laser operation such that laser light output pulses are produced, and
   superimposing a modulating current on said driving current pulses, said modulating current having a modulation depth of at least 1% of the driving current pulses such that random switching of the laser diode between transverse modes of operation is induced, said modulating current having a high modulation rate such that the induced switching of transverse modes is rapid, whereby the effect of many modes on the observed light output is averaged out over an entire pulse.

10. The method of claim 9 wherein said multimode laser diode is a broad area laser.

11. The method of claim 9 wherein said multimode laser diode is a phase-locked laser array.

12. The method of claim 9 wherein said laser light output pulses are apertured such that the observed light output is only a portion of the total light output from the laser diode.

13. The method of claim 9 wherein said driving current pulses are substantially above threshold such that the optical power output of the laser diode is at least one watt.

14. The method of claim 9 wherein said modulation rate is at least 50 modulations per pulse.

15. The method of claim 9 wherein said modulation rate is at least 1 MHz.

* * * * *